US008217450B1

United States Patent
Yu et al.

(10) Patent No.: US 8,217,450 B1
(45) Date of Patent: Jul. 10, 2012

(54) DOUBLE-GATE SEMICONDUCTOR DEVICE WITH GATE CONTACTS FORMED ADJACENT SIDEWALLS OF A FIN

(75) Inventors: Bin Yu, Cupertino, CA (US); Shibly S. Ahmed, San Jose, CA (US); Haihong Wang, Milpitas, CA (US)

(73) Assignee: Globalfoundries, Inc., Grand Cayman (KY)

( * ) Notice: Subject to any disclaimer, the term of this patent is extended or adjusted under 35 U.S.C. 154(b) by 1268 days.

(21) Appl. No.: 10/770,011

(22) Filed: Feb. 3, 2004

(51) Int. Cl.
*H01L 29/94* (2006.01)

(52) U.S. Cl. .......................... 257/331; 257/365; 257/368

(58) Field of Classification Search ................ 257/249, 257/270, 331, 47, 348, 365, 368, 347
See application file for complete search history.

(56) References Cited

U.S. PATENT DOCUMENTS

| | | | |
|---|---|---|---|
| 4,317,125 A | 2/1982 | Hughes et al. ................... 357/15 |
| 5,315,143 A | 5/1994 | Tsuji .............................. 257/351 |
| 5,563,082 A | 10/1996 | Mukai .............................. 437/41 |
| 5,739,057 A | 4/1998 | Tiwari et al. ................... 438/172 |
| 6,107,141 A | 8/2000 | Hsu et al. ....................... 438/267 |
| 6,159,782 A | 12/2000 | Xiang et al. ................... 438/197 |
| 6,300,182 B1 | 10/2001 | Yu ................................. 438/217 |
| 6,333,247 B1 | 12/2001 | Chan et al. ..................... 438/586 |
| 6,396,108 B1 | 5/2002 | Krivokapic et al. ........... 257/365 |
| 6,413,802 B1 | 7/2002 | Hu et al. ......................... 438/151 |
| 6,458,662 B1 | 10/2002 | Yu ................................... 438/286 |
| 6,472,258 B1 * | 10/2002 | Adkisson et al. .............. 438/192 |
| 6,483,171 B1 | 11/2002 | Forbes et al. .................. 257/627 |
| 6,525,403 B2 | 2/2003 | Inaba et al. .................... 257/347 |
| 6,528,381 B2 | 3/2003 | Lee et al. ........................ 438/373 |
| 6,610,576 B2 | 8/2003 | Nowak ........................... 438/301 |
| 6,611,029 B1 | 8/2003 | Ahmed et al. ................. 257/365 |
| 6,635,909 B2 | 10/2003 | Clark et al. .................... 257/192 |
| 6,657,252 B2 | 12/2003 | Fried et al. .................... 257/316 |
| 6,657,259 B2 | 12/2003 | Fried et al. .................... 257/350 |
| 6,689,650 B2 | 2/2004 | Gambino et al. ............. 438/157 |
| 6,812,119 B1 | 11/2004 | Ahmed et al. ................. 438/585 |
| 6,833,556 B2 * | 12/2004 | Grupp et al. .................... 257/24 |
| 6,853,020 B1 * | 2/2005 | Yu et al. ........................ 257/270 |
| 2003/0042531 A1 * | 3/2003 | Lee et al. ....................... 257/315 |
| 2003/0113970 A1 | 6/2003 | Fried et al. .................... 257/347 |
| 2003/0151077 A1 * | 8/2003 | Mathew et al. ............... 257/250 |
| 2004/0075121 A1 | 4/2004 | Yu et al. ........................ 257/288 |
| 2004/0108545 A1 * | 6/2004 | Ando ............................. 257/329 |
| 2004/0110331 A1 | 6/2004 | Yeo et al. ....................... 438/100 |
| 2004/0150071 A1 * | 8/2004 | Kondo et al. ................. 257/623 |
| 2004/0195628 A1 | 10/2004 | Wu et al. ....................... 257/351 |

(Continued)

OTHER PUBLICATIONS

Leland Chang et al.: "Gate Length Scaling and Threshold Voltage Control of Double-Gate MOSFETs," IEDM, Dec. 10, 2000, pp. 719-722.

(Continued)

*Primary Examiner* — Matthew E Warren
(74) *Attorney, Agent, or Firm* — Harrity & Harrity, LLP

(57) ABSTRACT

A double-gate semiconductor device includes a substrate, an insulating layer, a fin and two gates. The insulating layer is formed on the substrate and the fin is formed on the insulating layer. A first gate is formed on the insulating layer and is adjacent a first sidewall of the fin. The second gate is formed on the insulating layer and is adjacent a second sidewall of the fin opposite the first sidewall. The first and second gates both include a conductive material and are electrically separated by the fin.

15 Claims, 9 Drawing Sheets

U.S. PATENT DOCUMENTS

2004/0251487 A1* 12/2004 Wu et al. .................. 257/315

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang at al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/348,758; Judy Xilin An et al; filed Jan. 23, 2003; entitled "Germanium MOSFET Devices and Methods for Making Same", along with Preliminary Amendment filed Jun. 24, 2003.

Co-pending U.S. Appl. No. 10/602,061; Shibly S. Ahmed et al; filed Jun. 24, 2003; entitled "Double Gate Semiconductor Device Having Separate Gates".

Co-pending U.S. Appl. No. 10/290,330; Bin Yu et al; filed Nov. 8, 2002; entitled "Double-Gate Semiconductor Device".

* cited by examiner

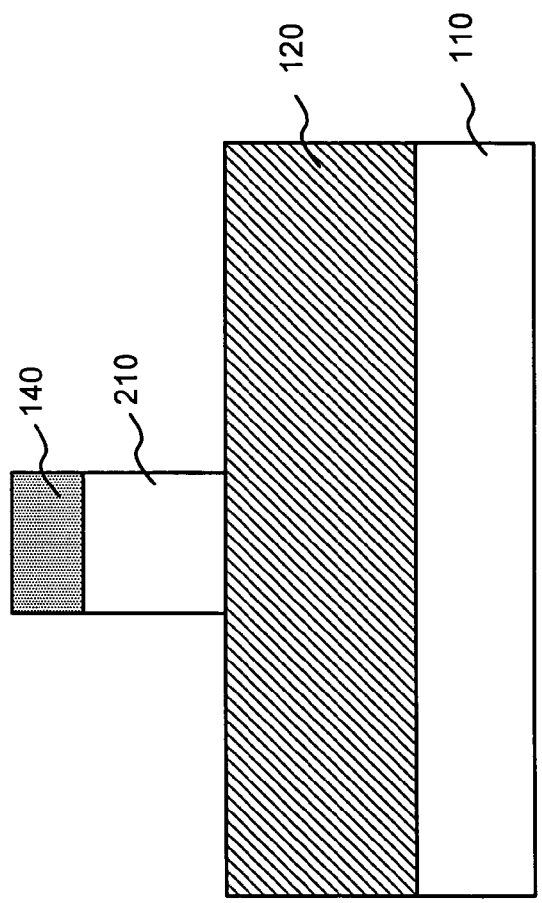
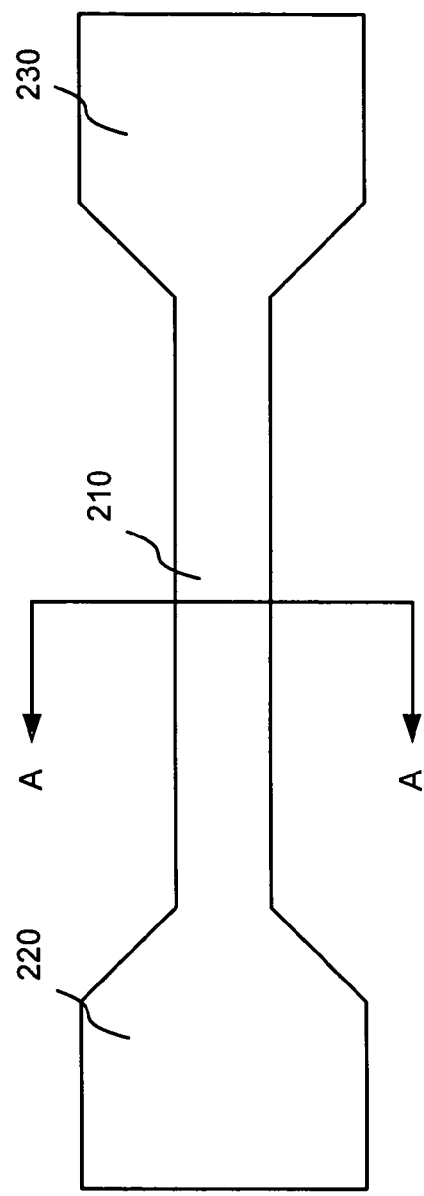

DOUBLE-GATE SEMICONDUCTOR DEVICE WITH GATE CONTACTS FORMED ADJACENT SIDEWALLS OF A FIN

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly, smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide FinFET devices with gate contacts located adjacent one or more sidewalls of a conductive fin.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a substrate, an insulating layer, a fin, a first gate and a second gate. The insulating layer is formed on the substrate and the fin is formed on the insulating layer, where the fin includes a first sidewall, a second sidewall opposite the first sidewall and a top surface. The first gate is formed adjacent the first sidewall of the fin and includes a conductive material. The second gate is formed adjacent the second sidewall of the fin and includes a conductive material. The first and second gates are electrically separated by the fin.

According to another aspect of the invention, a method of manufacturing a semiconductor device is provided. The method includes forming a fin on an insulating layer, where the fin includes first and second side surfaces and a top surface. The method also includes forming source and drain regions, depositing a gate material over the fin and planarizing the deposited gate material. The method further includes patterning and etching the gate material to form a first gate and a second gate on opposite sides of the fin, where the first and second gates are electrically separated by the fin.

According to a further aspect of the invention, a semiconductor device that includes a substrate, an insulating layer, a conductive fin, a source region, a drain region a first gate and a second gate is provided. The insulating layer is formed on the substrate and the conductive fin is formed on the insulating layer. The source region is formed above the insulating layer adjacent a first end of the fin and the drain region is formed above the insulating layer adjacent a second end of the fin opposite the first end. The first gate is formed on the insulating layer adjacent a first side surface of the fin and the second gate is formed on the insulating layer adjacent a second side surface of the fin opposite the first side surface. The first and second gates are electrically separated by the fin and no gate connection is formed on a top surface of the fin.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 2A is a cross-section illustrating the formation of a fin in accordance with an exemplary embodiment of the present invention.

FIG. 2B schematically illustrates the top view of the semiconductor device of FIG. 2A in accordance with an exemplary embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double-gate FinFET devices and methods of manufacturing such devices. The FinFET devices may include gate contacts formed adjacent sidewalls of fins.

Figure 1:
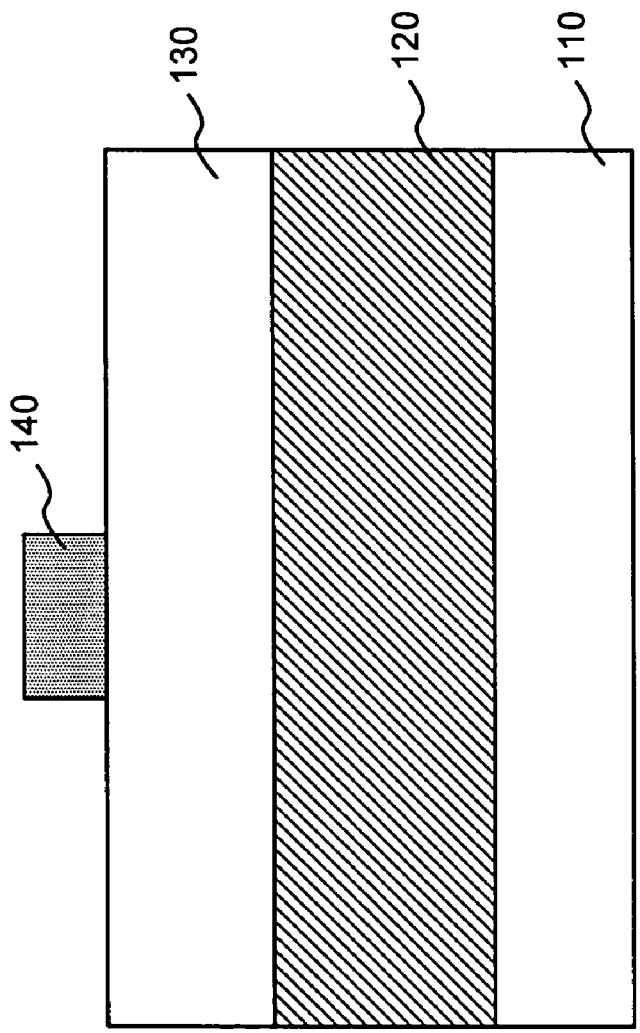
FIG. 1 is a cross-section illustrating exemplary layers that may be used for forming a fin in accordance with an embodiment of the present invention.

FIG. 1 illustrates the cross-section of a semiconductor device 100 formed in accordance with an exemplary embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

An optional dielectric layer (not shown), such as a silicon nitride layer or a silicon oxide layer, may be formed over silicon layer 130 to act as a protective cap during subsequent etching processes. A photoresist material may be deposited and patterned to form a photoresist mask 140 for subsequent processing. The photoresist may be deposited and patterned in any conventional manner.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, silicon layer 130 has been etched to form a fin 210 comprising silicon. The width of fin 210 may range from about 100 Å to about 1000 Å. In an exemplary implementation, the width of fin 210 may be about 500 Å. Due to the relatively narrow width of fin 210, it may be difficult to form an electrical contact on the planar top surface of fin 210. As a result, electrical contacts may be formed on the sidewalls of fin 210, as described in more detail below.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor 100 including source region 220 and drain region 230 formed adjacent fin 210 on buried oxide layer 120, according to an exemplary embodiment of the present invention. Photoresist mask 140 and buried oxide layer 120 are not shown in FIG. 2B for simplicity.

Figure 3:
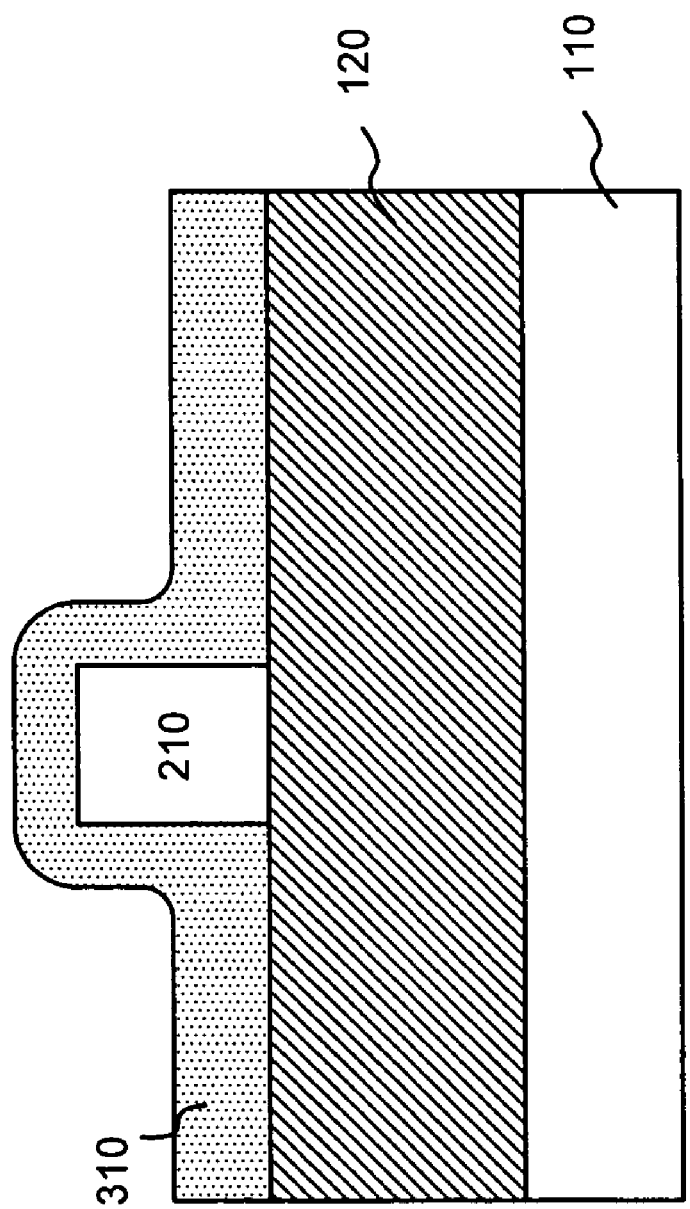
FIG. 3 is a cross-section illustrating the formation of a gate material on the device of FIG. 2A in accordance with an exemplary embodiment of the present invention.

Photoresist mask 140 may then be removed. A conductive layer 310 may be deposited over semiconductor 100 in a conventional manner, as illustrated in FIG. 3. The conductive layer 310 may be used as the gate material for the subsequently formed gates. In an exemplary implementation, conductive layer 310 may include polysilicon deposited using conventional chemical vapor deposition (CVD) to a thickness ranging from about 500 Å to about 1000 Å. Alternatively, other semiconducting materials, such as germanium or combinations of silicon and germanium, or various metals, such as tungsten, cobalt, titanium, tantalum or molybdenum, may be used as the gate material.

Conductive layer 310 may be doped with n-type or p-type impurities, based on the particular end device requirements. For example, conductive layer 310 may be doped in situ. Alternatively, conductive layer 310 may be doped by implanting n-type or p-type impurities. In either case, the particular implantation dosage may be based on the particular end device requirements.

Figure 4:
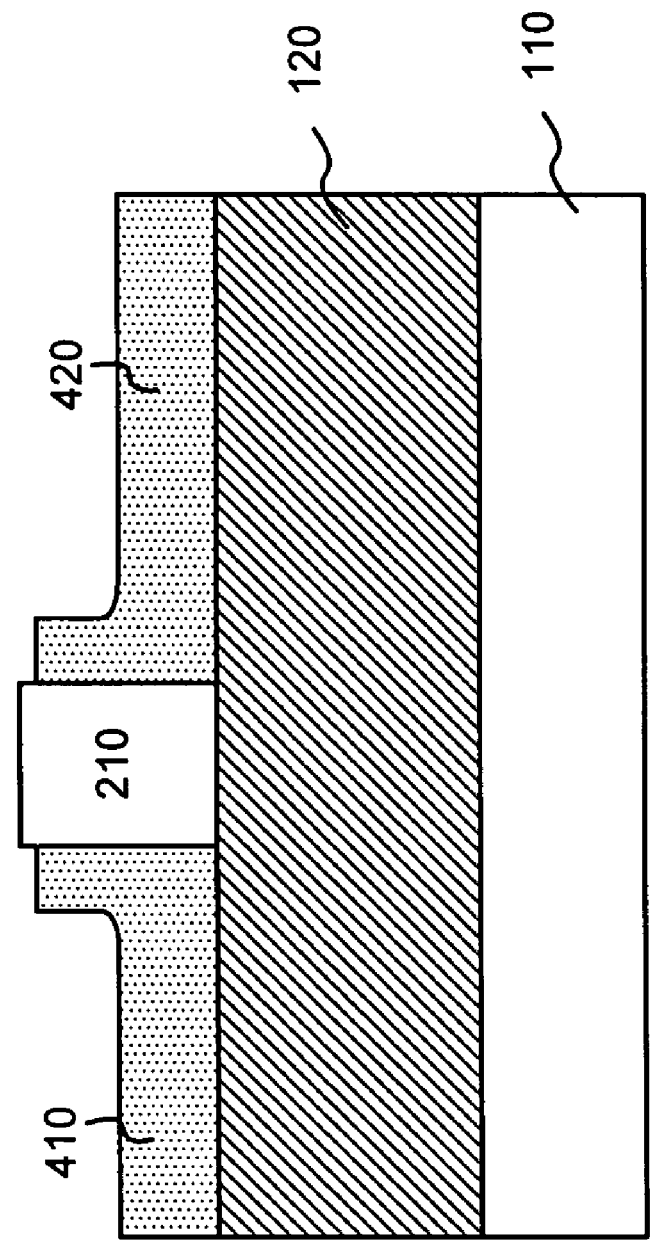
FIG. 4 is a cross-section illustrating the planarizing of the gate material in accordance with an exemplary embodiment of the present invention.

Semiconductor device 100 may then be planarized. For example, a chemical-mechanical polishing (CMP) may be performed so that the gate material (i.e., conductive layer 310) is even with or nearly even with the top of fin 210 in the vertical direction, as illustrated in FIG. 4. Referring to FIG. 4, after the CMP, the gate material layer 310 includes regions 410 and 420 effectively separated, both physically and electrically, by fin 210.

In some implementations consistent with the present invention in which gate material layer 310 comprises silicon, regions 410 and 420 may be silicided. For example, a metal, such as tungsten, cobalt, titanium, tantalum or molybdenum, may be deposited on the upper surfaces of regions 410 and 420. A thermal annealing may then be performed to create a meal-silicide compound. According to an exemplary embodiment, the metal may be deposited to a desired thickness and the annealing performed at a temperature such that all or nearly all of the silicon in regions 410 and 420 may react to form a silicide material in regions 410 and 420. That is, regions 410 and 420 may be become fully silicided during the reaction between the silicon and the metal. The fully silicided gate material in regions 410 and 420 results in the subsequently formed gates experiencing little or no poly depletion effects.

Figure 5:
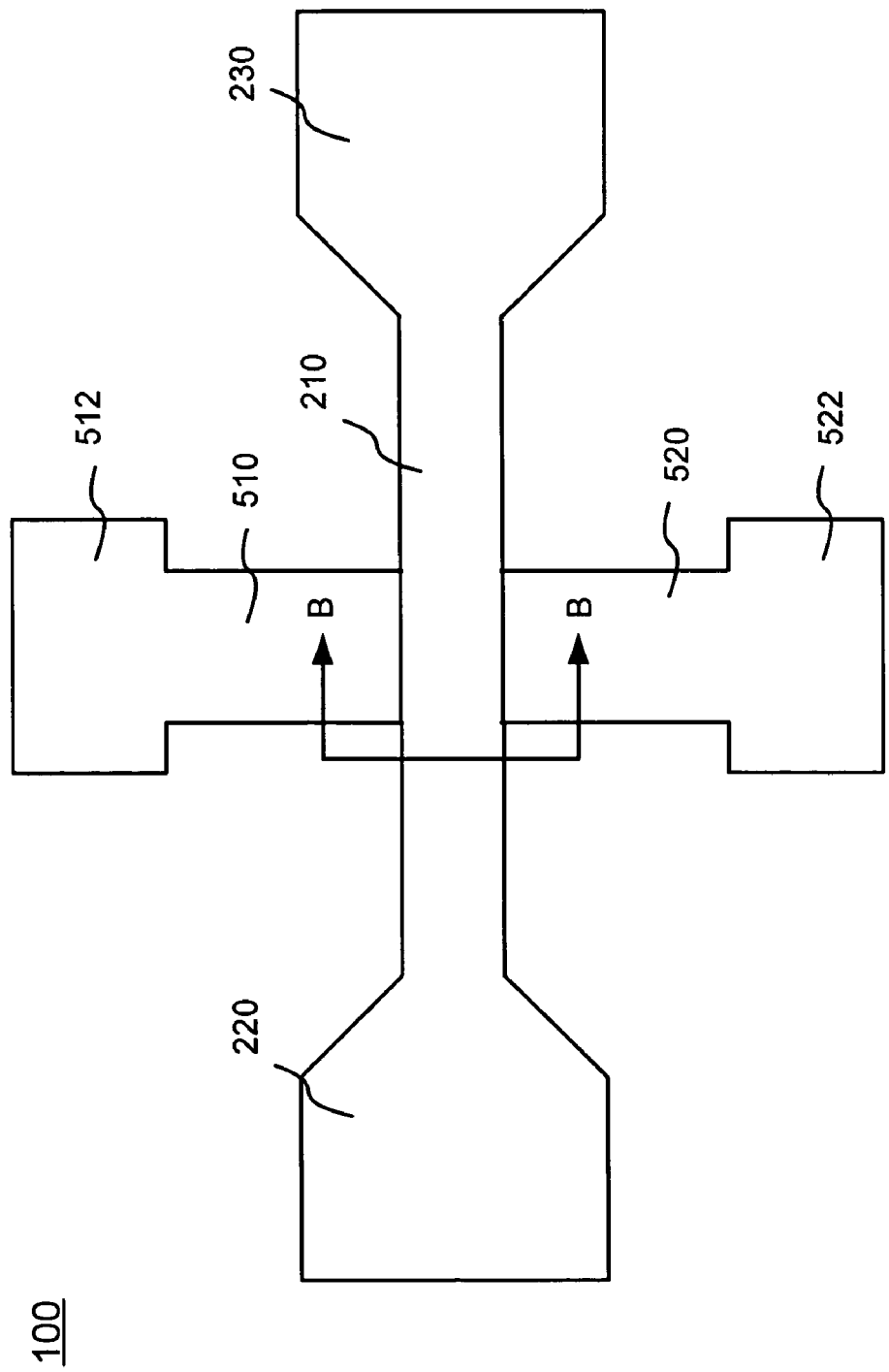
FIG. 5 is a top view illustrating an exemplary double-gate device formed in accordance with an exemplary embodiment of the present invention.

Regions 410 and 420 may then be patterned and etched to form one or more gates for semiconductor device 100. For example, FIG. 5 illustrates a top view of semiconductor device 100 consistent with the present invention after the gates have been formed. As illustrated, semiconductor device 100 includes a double gate structure with gates 510 and 520 disposed on either side of fin 210. Gates 510 and 520 may also include gate electrodes 512 and 522 formed at the respective ends of gates 510 and 520, as illustrated in FIG. 5.

The source/drain regions 220 and 230 may then be doped. The particular implantation dosages and energies may be selected based on the particular end device requirements. In an exemplary implementation, an n-type dopant, such as phosphorous may be implanted at a dosage of about $1 \times 10^{19}$ to about $1 \times 10^{20}$ atoms/cm$^2$ and an implantation energy of about 10 KeV to about 50 KeV. Alternatively, a p-type dopant, such as boron, may be implanted at a dosage of about $1 \times 10^{19}$ to about $1 \times 10^{20}$ atoms/cm$^2$ and an implantation energy of about 10 KeV to about 50 KeV.

Other implantation dosages and energies may also be used and one of ordinary skill in this art would be able to optimize the source/drain implantation process based on the particular circuit requirements. In addition, sidewall spacers may optionally be formed prior to the source/drain ion implantation to control the location of the source/drain junctions based on the particular circuit requirements. Activation annealing may then be performed to activate the source/drain regions 220 and 230.

Figure 6:
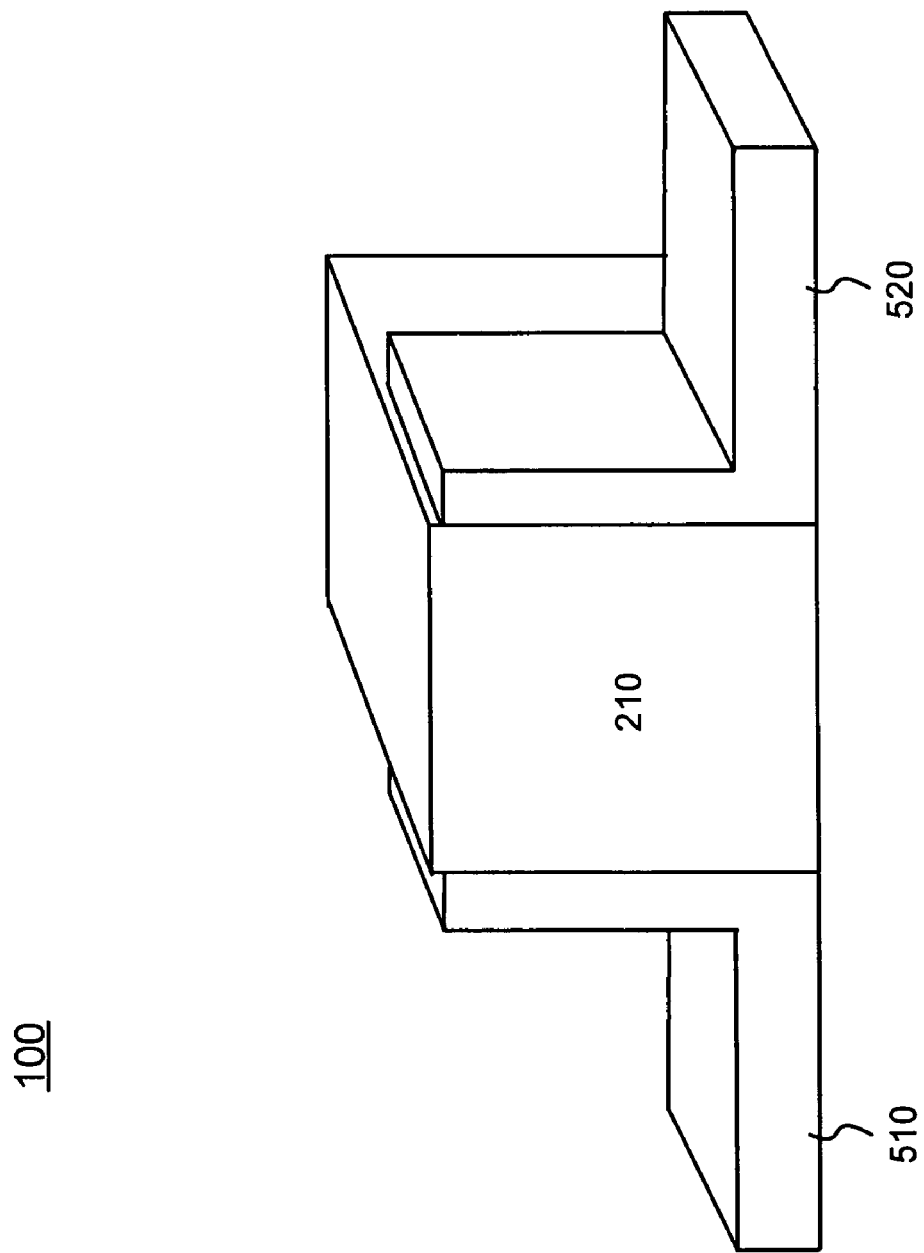
FIG. 6 is a perspective view of the semiconductor device of FIG. 5 illustrating the gate contacts in accordance with an exemplary embodiment of the present invention.

FIG. 6 illustrates an exemplary perspective view of semiconductor device 100 taken along line BB of FIG. 5. Referring to FIG. 6, gates 510 and 520 are formed adjacent the respective sidewalls of fin 210. This enables gates 510 and 520 to establish good electrical contact with fin 210, as opposed to forming the gate contact on the narrow planar top surface of fin 210. This facilitates programming of semiconductor device 100.

The resulting semiconductor device 100 illustrated in FIGS. 5 and 6 is a double-gate device with a first gate 510 and a second gate 520. The gates are electrically and physically separated by fin 210. Each of the gates 510 and 520 may be separately biased when used in a circuit since they are effectively isolated or disconnected from each other by fin 210. For example, gate 510 may be biased with a different voltage than gate 520 based on the particular circuit requirements. Independently biasing the gates increases the flexibility of semiconductor device 100 during circuit design.

In addition, in some implementations, gates 510 and 520 may be asymmetrically doped, i.e., gate 510 may be predominately doped with n-type impurities and gate 520 may be predominately doped with p-type impurities. In this implementation, one of gates 510/520 may be masked while the other gate is implanted. The process may then be repeated for the other gate, with each gate being doped with a different impurity. As a result, gates 510 and 520 will have different work functions, $\Phi_1$ and $\Phi_2$, respectively. The work functions $\Phi_1$ and $\Phi_2$ may be adjusted independently of each other by varying the dopant concentrations during the implant processes based on the particular circuit requirements. In addition, by varying the dopant concentrations, the threshold voltage of the gates 510 and 520 may also be independently adjusted based on the particular circuit requirements. One of ordinary skill in the art would be able to optimize the dopant concentrations to achieve the desired work function and threshold voltage associated with gates 510 and 520, respectively.

Thus, in accordance with the present invention, a double-gate FinFET device is formed with gate contacts formed on the sidewalls of fin 210. The resulting structure exhibits good short channel behavior. In addition, gates 510 and 520 may be fully silicided so that little or no poly depletion effect occurs, thereby yielding better device performance. The gates 510 and 520 may also be asymmetrically doped to have different work functions and threshold voltages, thereby providing further flexibility. The present invention can also be easily integrated into conventional processing.

Figure 7:
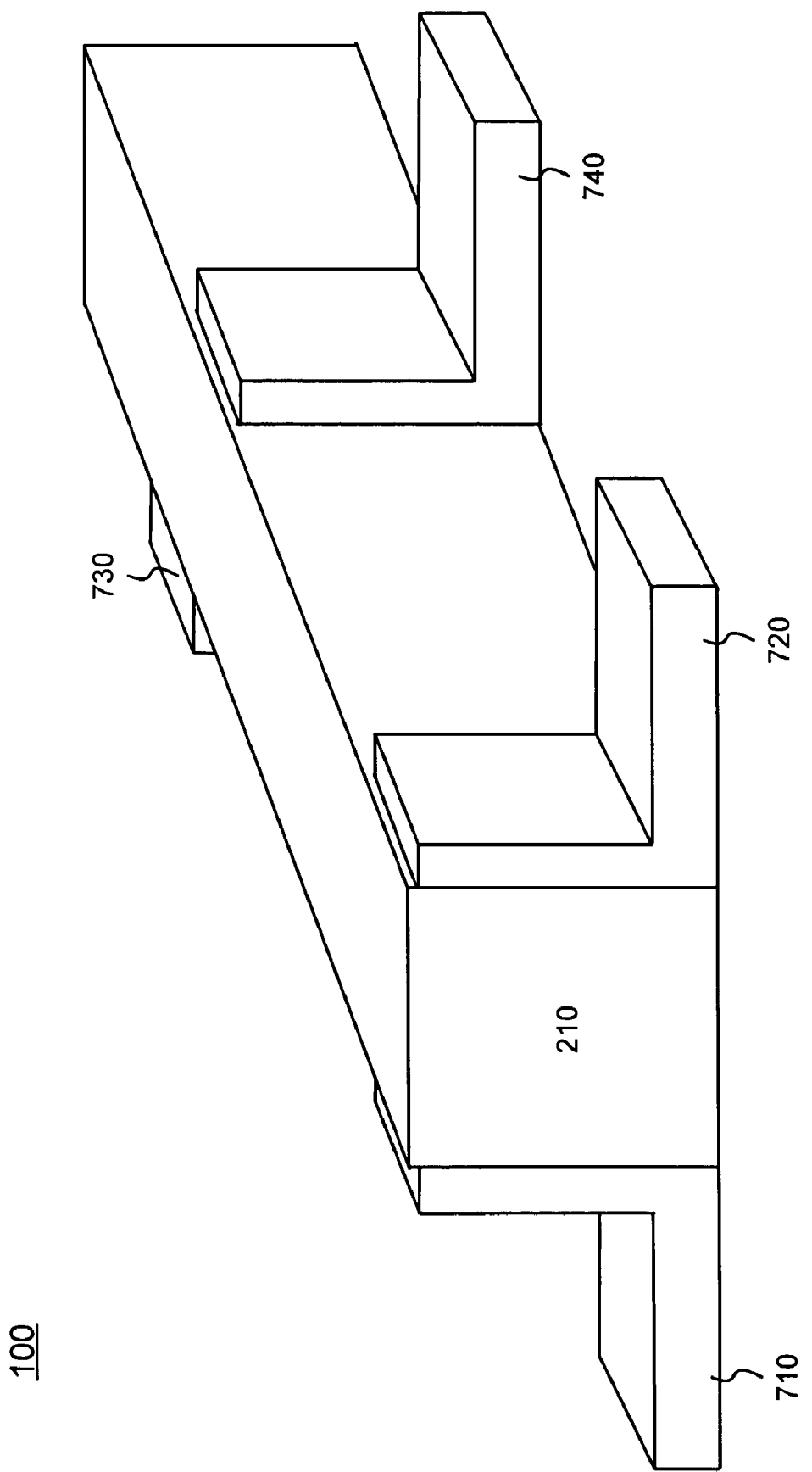
FIG. 7 is a perspective view of a semiconductor device formed in accordance with another exemplary embodiment of the present invention.

In addition, in alternative implementations, more than one set of gate contacts may be formed adjacent fin 210. For example, FIG. 7 illustrates an exemplary implementation in which two sets of gates are formed on either side of fin 210. Referring to FIG. 7, gate contacts 710 and 720 are formed in a manner similar to gates 510 and 520 described above. That is, a gate material may be deposited and planarized, followed by a patterning and etching process to form gate contacts 710 and 720 on opposing sides of fin 210. In addition, the gate material may also be patterned and etched to form gate contacts 730 and 740 on opposite sidewalls of fin 210. The additional gate contacts provide increases flexibility in programming semiconductor device 100.

Other Embodiments

Figure 8A:
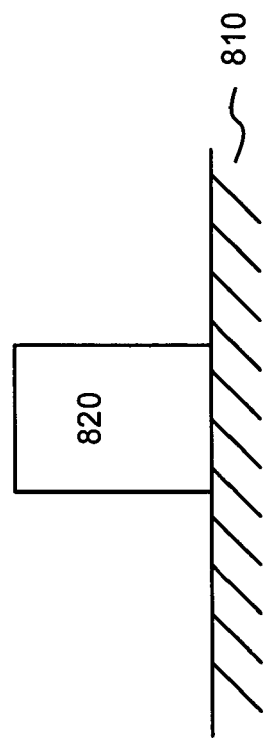
FIGS. 8A-8E are cross-sections illustrating the formation of N-channel and P-channel devices in accordance with another embodiment of the present invention.

In other embodiments of the present invention, FinFETs including both n-type and p-type devices may be formed. For example, FIG. 8A illustrates a cross-sectional view of semiconductor device 800 that includes a fin 820 formed on a buried oxide layer 810. Buried oxide layer 810 may be formed on a substrate comprising, for example, silicon, germanium or combinations of silicon-germanium (not shown).

Figure 8B:
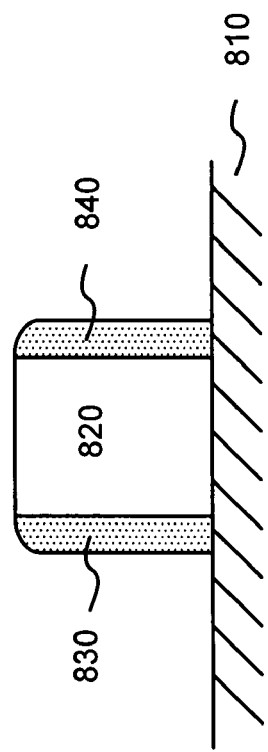
Figure 8C:
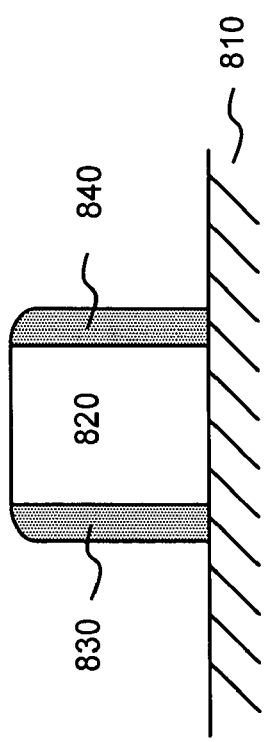

A semiconducting material, such as amorphous silicon, may be deposited on semiconductor device 800 and etched in a conventional manner to form sidewall spacers 830 and 840, as illustrated in FIG. 8B. Referring to FIG. 8B, sidewall spacers 830 and 840 may be formed on either side of fin 820. Next, a metal, such as nickel, may be deposited over spacers 830 and 840, followed by a metal induced crystallization (MIC) process. For example, semiconductor device 800 may be annealed to transform the amorphous silicon in sidewall spacers 830 and 840 into a crystalline silicon, as illustrated in FIG. 8C.

Figure 8D:
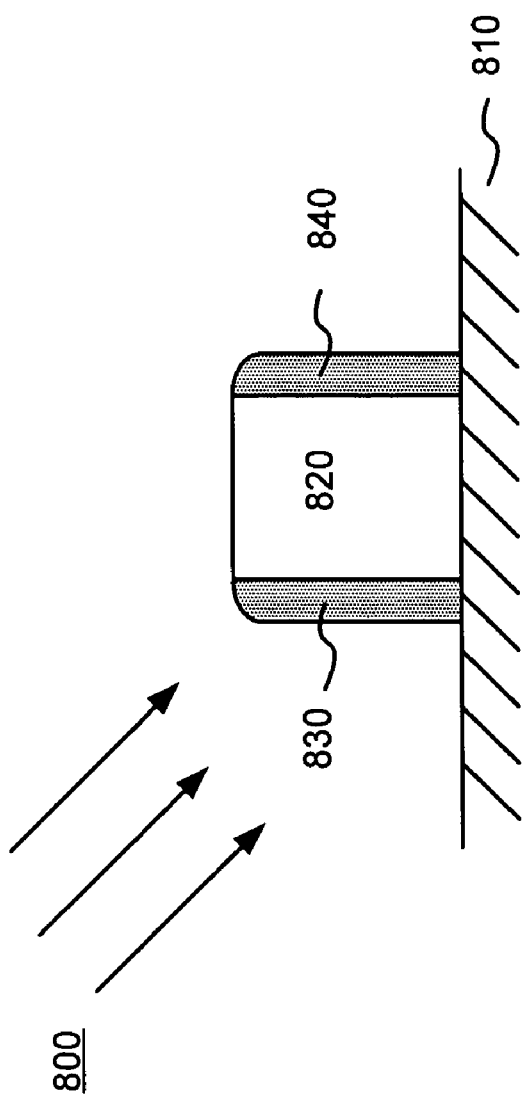
Figure 8E:
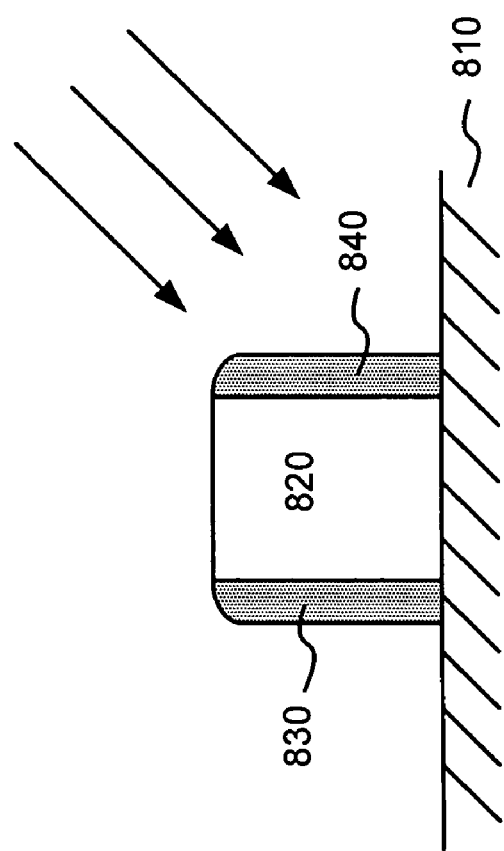

After the MIC process, impurities may be implanted into sidewall spacers 830 and 840. For example, n-type impurities may be implanted at a tilt angle, as illustrated in FIG. 8D. During the implantation, fin 820 and spacer 830 shield spacer 840 from the impurities. As a result, none or substantially none of the n-type impurities are implanted in spacer 840. Next, a second tilt angle implant process may occur, as illustrated in FIG. 8E. During this implantation, p-type impurities may be implanted in spacer 840. Similar to the first implantation, spacer 840 and fin 820 effectively shield spacer 830 from the implantation of p-type impurities. As a result, semiconductor device 800 includes a sidewall spacer 830 with n-type doping and sidewall spacer 840 with p-type doping.

After the spacers are implanted, a gate material may be formed over semiconductor device 800. The gate material may be patterned and etched to form gates adjacent spacers 830 and 840. The gates may effectively include n-type doped material and p-type doped material on either side of fin 210 (i.e., spacers 830 and 840). As a result, a merged FinFET device including both n-type and p-type devices may be formed.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques may be employed and, hence, the details of such techniques have not been set forth herein in detail. In addition, while series of processes for forming the semiconductor devices of FIGS. 5-7 have been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A semiconductor device, comprising:
a substrate;
an insulating layer formed on the substrate;
a fin formed on the insulating layer, the fin comprising a first sidewall, a second sidewall opposite the first sidewall, and a top surface, the fin having a width ranging from approximately 100 Å to 1000 Å;
a first gate formed adjacent the first sidewall of the fin, the first gate comprising a conductive material and being doped with an n-type impurity without being doped with a p-type impurity;
a second gate formed adjacent the second sidewall of the fin, the second gate comprising a conductive material and being doped with the p-type impurity without being doped with the n-type impurity, the first gate and the second gate being electrically separated by the fin;
a third gate formed adjacent the first sidewall of the fin, the third gate comprising a conductive material, the third gate being physically separated from the first gate; and
a fourth gate formed adjacent the second sidewall of the fin, the fourth gate comprising a conductive material, the fourth gate being physically separated from the second gate, and the third gate and the fourth gate being electrically separated by the fin.

2. The semiconductor device of claim 1, where no gate connection is formed on the top surface of the fin.

3. The semiconductor device of claim 1, further comprising:
a source region formed above the insulating layer adjacent a first end of the fin; and
a drain region formed above the insulating layer adjacent a second end of the fin opposite the first end.

4. The semiconductor device of claim 1, where the insulating layer comprises a buried oxide layer and the fin comprises at least one of silicon or germanium.

5. The semiconductor device of claim 4, where the buried oxide layer has a thickness ranging from about 1500 Å to about 3000 Å.

6. The semiconductor device of claim 1, where the conductive material of the first gate, the second gate, the third gate, and the fourth gate comprises at least one of polycrystalline silicon, a metal, or a metal-silicide compound.

7. The semiconductor device of claim 1, where the first gate and the second gate are both substantially fully silicided and are physically separated from each other.

8. A semiconductor device, comprising:
a substrate;
an insulating layer formed on the substrate;
a conductive fin formed on the insulating layer, the fin having a width ranging from approximately 100 Å to 1000 Å;
a source region formed above the insulating layer adjacent a first end of the fin;
a drain region formed above the insulating layer adjacent a second end of the fin opposite the first end;
a first gate formed on the insulating layer adjacent a first side surface of the fin, the first gate being doped with an n-type impurity without being doped with a p-type impurity;
a second gate formed on the insulating layer adjacent a second side surface of the fin opposite the first side surface, the second gate being doped with the p-type impurity without being doped with the n-type impurity, the first gate and the second gate being electrically separated by the fin, and no gate connection being formed on a top surface of the fin;
a third gate formed on the insulating layer adjacent the first side surface of the fin; and
a fourth gate formed on the insulating layer adjacent the second side surface of the fin, the third gate and the fourth gate being electrically separated by the fin.

9. The semiconductor device of claim 8, where the insulating layer comprises a buried oxide layer and the fin comprises at least one of silicon or germanium.

10. The semiconductor device of claim 8, where each of the first gate, the second gate, the third gate, and the fourth gate comprises at least one of polycrystalline silicon, a metal, or a metal-silicide compound.

11. The semiconductor device of claim 8, where the first gate and the second gate are both substantially fully silicided.

12. The semiconductor device of claim 8, where the first gate and the second gate are electrically isolated from each other and have different threshold voltages.

13. The semiconductor device of claim 8, where the first gate and the third gate are physically separated from each other, and the second gate and the fourth gate are physically separated from each other.

14. A semiconductor transistor device, comprising:
a substrate;
an insulating layer formed on the substrate;
a fin formed on the insulating layer, the fin comprising a first sidewall, a second sidewall opposite the first sidewall, and a top surface;
a first gate formed adjacent the first sidewall of the fin, the first gate being doped with an n-type impurity without being doped with a p-type impurity;
a second gate formed adjacent the second sidewall of the fin, the second gate being doped with the p-type impurity without being doped with the n-type impurity, and the first gate and the second gate being electrically separated by the fin;
a third gate formed adjacent the first sidewall of the fin, the third gate being physically separated from the first gate; and
a fourth gate formed adjacent the second sidewall of the fin, the fourth gate being physically separated from the second gate, and the third gate and the fourth gate being electrically separated by the fin.

15. The semiconductor transistor device of claim 14, where each of the first gate, the second gate, the third gate, and the fourth gate is electrically isolated from each other one of the first gate, the second gate, the third gate, and the fourth gate.

* * * * *